(12) United States Patent
Itoyama et al.

(10) Patent No.: US 9,370,853 B2
(45) Date of Patent: Jun. 21, 2016

(54) RESIN LAPPING PLATE AND LAPPING METHOD USING THE SAME

(71) Applicant: Fujibo Holdings, Inc., Tokyo (JP)

(72) Inventors: Kouki Itoyama, Kanagawa (JP); Motofumi Suzuki, Chiba (JP)

(73) Assignee: FUJIBO HOLDINGS, INC., Tokyo (JP)

( * ) Notice: Subject to any disclaimer, the term of this patent is extended or adjusted under 35 U.S.C. 154(b) by 0 days.

(21) Appl. No.: 14/570,789

(22) Filed: Dec. 15, 2014

(65) Prior Publication Data

US 2015/0165586 A1    Jun. 18, 2015

(30) Foreign Application Priority Data

Dec. 17, 2013  (JP) .................................. 2013-260556
Sep. 26, 2014  (JP) .................................. 2014-197550

(51) Int. Cl.
| | |
|---|---|
| *B24B 37/20* | (2012.01) |
| *B24B 37/14* | (2012.01) |
| *H01L 21/304* | (2006.01) |
| *B24B 37/24* | (2012.01) |
| *H01L 21/02* | (2006.01) |
| *H01L 29/16* | (2006.01) |

(52) U.S. Cl.
CPC ................ *B24B 37/14* (2013.01); *B24B 37/24* (2013.01); *H01L 21/02013* (2013.01); *H01L 21/304* (2013.01); *H01L 29/1608* (2013.01)

(58) Field of Classification Search
CPC .. B24B 37/14; B24B 37/24; H01L 21/02013; H01L 21/304; H01L 29/1608
USPC .............................. 451/539–541, 548–551, 41
See application file for complete search history.

(56) References Cited

U.S. PATENT DOCUMENTS

| | | | | | |
|---|---|---|---|---|---|
| 2,749,683 | A | * | 6/1956 | Soderman ................ | B24D 7/02 451/550 |
| 2,804,733 | A | * | 9/1957 | Hurst ...................... | B24D 11/00 451/529 |
| 2,989,826 | A | * | 6/1961 | Lamesch .................. | B24D 7/06 451/548 |
| 3,041,799 | A | * | 7/1962 | Kemman ................. | B24D 7/10 451/450 |
| 3,353,308 | A | * | 11/1967 | Zane ...................... | B24D 11/00 451/529 |
| 3,526,999 | A | * | 9/1970 | Jagers ..................... | B24D 5/12 125/13.02 |
| 3,628,292 | A | * | 12/1971 | Rue ........................ | B24D 5/12 125/15 |
| 4,037,367 | A | * | 7/1977 | Kruse ..................... | B24D 7/06 451/551 |
| 4,187,082 | A | * | 2/1980 | Guerra ................... | B24D 15/04 433/229 |
| 4,918,872 | A | * | 4/1990 | Sato ....................... | B24D 7/06 451/450 |
| 5,584,750 | A | * | 12/1996 | Ishida .................... | B24B 37/14 451/288 |
| 6,802,761 | B1 | * | 10/2004 | Beaucage ............... | B24D 18/00 451/28 |

(Continued)

FOREIGN PATENT DOCUMENTS

| | | | |
|---|---|---|---|
| JP | 2003053834 | A * | 2/2003 |
| JP | 2005-131755 | | 5/2005 |

(Continued)

*Primary Examiner* — George Nguyen
(74) *Attorney, Agent, or Firm* — Squire Patton Boggs (US) LLP

(57) ABSTRACT

The present invention provides a lapping plate, which provides a high lapping rate and also can suppress the generation of scratches on a surface of a polishing workpiece. The present invention provides a resin lapping plate comprising a resin sheet comprising a thermosetting polyurethane resin and having an opening rate of 10 to 50% and a Young's modulus of $7.0 \times 10^7$ to $5.0 \times 10^8$ N/m$^2$.

18 Claims, 2 Drawing Sheets

(56) References Cited

U.S. PATENT DOCUMENTS

| | | | |
|---|---|---|---|
| 6,932,684 B1 * | 8/2005 | Hunt | B24B 3/361 451/264 |
| 6,939,212 B1 * | 9/2005 | Pham | B24B 21/04 451/340 |
| 7,470,170 B2 * | 12/2008 | Shimomura | B24D 3/24 451/41 |
| 8,002,607 B2 * | 8/2011 | Fukuda | B24B 37/005 451/10 |
| 9,011,212 B2 * | 4/2015 | Itoyama | C08J 9/12 451/526 |
| 2001/0036738 A1 * | 11/2001 | Hatanaka | B24B 37/013 438/693 |
| 2001/0044267 A1 * | 11/2001 | Terashima | B24B 37/048 451/285 |
| 2002/0126421 A1 * | 9/2002 | Takahashi | B24B 37/00 360/313 |
| 2005/0260938 A1 * | 11/2005 | Okuda | B24B 37/015 451/285 |
| 2007/0045232 A1 * | 3/2007 | Murai | B24B 37/30 216/88 |
| 2007/0054607 A1 * | 3/2007 | Yasuoka | B24B 37/08 451/56 |
| 2007/0122548 A1 * | 5/2007 | Inaba | B24B 37/12 427/180 |
| 2008/0299884 A1 * | 12/2008 | Moroto | B24B 5/14 451/548 |
| 2008/0318493 A1 * | 12/2008 | Aida | B24B 37/08 451/36 |
| 2009/0165768 A1 * | 7/2009 | Kasashima | B23D 61/028 125/15 |
| 2010/0047586 A1 * | 2/2010 | Morooka | B32B 27/08 428/424.2 |
| 2011/0053479 A1 * | 3/2011 | Kim | B24D 7/06 451/548 |
| 2011/0073094 A1 * | 3/2011 | Tselesin | B24B 37/22 125/15 |
| 2011/0076928 A1 * | 3/2011 | James | B24B 37/24 451/548 |
| 2011/0239444 A1 * | 10/2011 | Fukuoka | B24B 37/11 29/603.16 |
| 2011/0281511 A1 * | 11/2011 | Keuler | B24D 3/20 451/548 |
| 2012/0037786 A1 * | 2/2012 | Nakata | F16C 23/045 248/636 |
| 2013/0252521 A1 * | 9/2013 | Kasashima | B24D 5/12 451/548 |
| 2014/0300036 A1 * | 10/2014 | Rothfuss | B22D 1/005 266/217 |
| 2015/0010339 A1 * | 1/2015 | Ichijo | G03G 21/0017 399/350 |

FOREIGN PATENT DOCUMENTS

| | | |
|---|---|---|
| JP | 2007-61961 | 3/2007 |
| JP | 2008-238398 | 10/2008 |
| JP | 2013-52455 | 3/2013 |

* cited by examiner

RESIN LAPPING PLATE AND LAPPING METHOD USING THE SAME

TECHNICAL FIELD

The present invention relates to a resin lapping plate, and a lapping method using the same.

BACKGROUND ART

In recent years, as next-generation power semiconductor materials, materials such as silicon carbide (SiC), gallium nitride (GaN), diamond, sapphire ($Al_2O_3$) and aluminum nitride (AlN), which are wide band-gap semiconductors, have been paid attention to. For example, silicon carbide (SiC) has excellent physical property values such as a band gap 3 times and a dielectric breakdown electric field strength about 7 times those of Si semiconductors, and is superior in high-temperature operability to current silicon semiconductors and excellent in terms of its small size and high energy saving effect as well. Further sapphire wafers are exhibiting increasing importance as electronic devices having optical elements, for example, components for high-performance overhead projectors, due to their chemical stability, optical property (transparency), mechanical strength, thermal property (good heat conductivity) and the like. The diameter enlargement and the mass production of substrates are advanced toward the real spread of these next-generation power devices, and along therewith, the importance of the substrate processing technology is also increasing. In the processing, as in Si, a circular cylindrical single crystal (ingot) to be used for wafers is sliced and thereby cut out into a circular disc shape. Then, the surface of the sliced circular disc-shape single crystal is to be flattened, but first, lapping processing in order to roughly remove the roughness of its surface is carried out by using a lapping plate. Thereafter, polishing processing in order to further improve the flatness of the surface of the circular disc-shape single crystal and remove micro flaws on its surface to thereby make a mirror surface is carried out. Therefore, making the flatness of a circular disc-shape single crystal surface to be enhanced and micro flaws to be few by lapping processing is important in order to impart an influence to polishing processing thereafter.

Since SiC is by far harder than Si and is also a material chemically and thermally stable, the employment of the usual abrasive grains to be used for lapping processing of Si and the wet etching to be used for removal of damaged layers of Si as a workpiece, for processing of SiC, is conventionally difficult. Hence, the processing of SiC cannot help relying on the chemical mechanical polishing (CMP), and the processing of SiC resultantly takes a long time and decreases the productivity. Further sapphire also has a modified Mohs hardness next to diamond and silicon carbide and a high resistance to chemicals, and is very difficult to process.

Then, for lapping processing of high-hardness, brittle, difficult-to-grind materials such as SiC, a lapping plate high in hardness such as a cast iron or a ceramic substrate is used. In recent years, in order to make the flatness of a circular disc-shape single crystal surface to be enhanced and the micro flaws to be few, there is also employed the lapping processing (hereinafter, also referred to as "diamond lapping") in which a metal-based plate of copper, a resin-coated copper, tin or the like is used and the plate and diamond abrasive grains are combined. Since the plate of copper, a resin-coated copper, tin or the like is softer than that of cast iron or the like, and even if the diamond abrasive grains are used in the state of being free abrasive grains, the abrasive grains are embedded in the plate surface, the abrasive grains exhibit an action and effect similar to those of fixed abrasive grains (see, for example, Patent Document 1). In order to shorten the time for abrasive grains to be embedded in a plate surface, there is further disclosed means to embed the abrasive grains in the plate surface by imparting an ultrasonic vibration to a pressing member (see, for example, Patent Documents 2 and 3).

CITATION LIST

Patent Document

[Patent Document 1] Japanese Patent Application Laid-Open No. 2007-61961
[Patent Document 2] Japanese Patent Application Laid-Open No. 2008-238398
[Patent Document 3] Japanese Patent Application Laid-Open No. 2008-238398

SUMMARY OF INVENTION

Technical Problem

In the means described in Patent documents 2 and 3, however, although the abrasive grains to be interposed between the pressing member and the plate are allowed to be embedded in the plate surface in a short time, the abrasive grains not interposed therebetween cannot be embedded. This makes uniform dispersion of the abrasive grains on the whole plate to be difficult, and is liable to decrease the lapping rate and cause scratches on a polishing workpiece surface of SiC or the like.

The present invention has been achieved in consideration of the above-mentioned situation, and an object thereof is to provide a lapping plate, which provides a high lapping rate and also can suppress the generation of scratches on a polishing workpiece surface, and a lapping method using the plate.

Solution to Problem

As a result of exhaustive studies to achieve the above object, the present inventors have found that by subjecting a polishing workpiece to lapping processing by using a specific resin plate being softer than metal-based plates and having a predetermined elasticity and a predetermined surface condition, the above object can be achieved, and this finding has led to the achievement of the present invention.

That is, the present invention provides a resin lapping plate comprising a resin sheet comprising a thermosetting polyurethane resin and having an opening rate of 10 to 50% and a Young's modulus of $7.0 \times 10^7$ to $5.0 \times 10^8$ $N/m^2$. Such a resin plate, since being softer than metal-based plates and having a suitable elasticity, can easily be embedded in its polished surface with microparticulate diamond abrasive grains. Hence, the resin plate, since being able to suppress the tumbling motion of diamond abrasive grains and the large protrusion of part of the diamond abrasive grains embedded in the polished surface of the plate, can suppress the generation of scratches on a polishing workpiece. The resin plate, since the diamond abrasive grains embedded in the polished surface of the plate are protruded to a degree of being able to effectively participating in lapping, further can secure a high lapping rate. The resin plate, since being able to retain much of a polishing slurry containing the diamond abrasive grains and secure also the area of an effective polished surface, is further enabled to raise the lapping rate. In the resin plate according to the present invention, it is preferable that the resin sheet has a polished surface, and the polished surface has grooves formed thereon.

The present invention provides a lapping method of subjecting a polishing workpiece to lapping processing by a resin lapping plate according to any one of claims 1 to 4 in the presence of diamond abrasive grains. The polishing workpiece is preferably a substrate of silicon carbide, sapphire, silicon nitride or gallium nitride; the diamond abrasive grains are preferably supplied in the state of being contained in a polishing slurry between the resin lapping plate and the polishing workpiece; at least part of the diamond abrasive grains are preferably embedded from the polished surface side of the resin lapping plate in the resin plate; and the average grain diameter of the diamond abrasive grains is more preferably 1.0 to 10 µm.

Advantageous Effects of Invention

The present invention can provide a lapping plate, which provides a high lapping rate and also can suppress the generation of scratches on a polishing workpiece surface, and a lapping method using the plate.

DESCRIPTION OF EMBODIMENT

Figure 1:
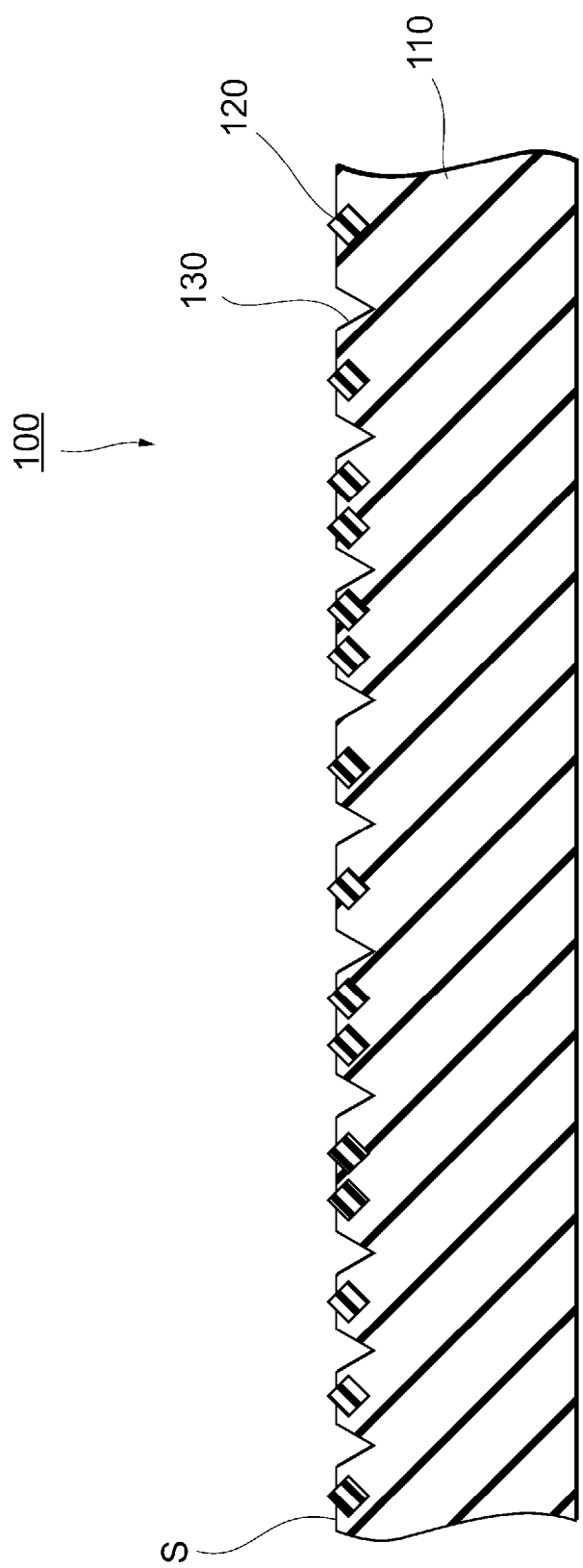
FIG. 1 is a cross-sectional view schematically illustrating one example of the resin lapping plate according to the present invention.

Hereinafter, by reference to the drawings as required, an embodiment to carry out the present invention (hereinafter, simply referred to as "the present embodiment") will be described in detail. Here, in the drawings, the same reference sign is attached to the same element, and duplicated description will be omitted. The positional relation vertical and horizontal and other positional relations are based on the positional relations illustrated in the drawings unless otherwise specified. Further, the dimensional ratios in the drawings are not limited to the ratios illustrated therein.

A resin lapping plate according to the present embodiment (hereinafter, simply referred to as "resin plate") comprises a resin sheet comprising a thermosetting polyurethane resin and having an opening rate of 10 to 50% and a Young's modulus of $7.0 \times 10^7$ to $5.0 \times 10^8$ N/m². FIG. 1 is a cross-sectional view schematically illustrating a resin plate according to the present embodiment. The resin plate 100 according to the present embodiment has a resin sheet 110. Grooves 130 are formed on a polished surface S of the resin plate 100; and diamond abrasive grains 120 may be embedded from the polished surface S side in the resin sheet 110 before and/or during lapping processing. Here, in the present description, "lapping" means a polishing method in which a workpiece (polishing workpiece) and a tool (lap: resin plate) are rubbed against each other in the state that an abrasive having free abrasive grains dispersed therein is made to intervene between the workpiece and the tool.

The resin sheet 110 exhibits elasticity, and has the polished surface S. The resin sheet 110 contains the thermosetting polyurethane resin, and its content proportion is, with respect to the total amount of resins constituting the resin sheet 110, preferably 50% by mass or more, more preferably 80% by mass or more, still more preferably 90% by mass or more, and especially preferably 95% by mass or more. The resin sheet 110 may contain thermosetting resins other than the thermosetting polyurethane resin, and other resins in the range of not inhibiting the achievement of the object of the present invention.

Examples of the thermosetting polyurethane resin include thermosetting polyester-based polyurethane resins, polyether-based polyurethane resins and polycarbonate-based polyurethane resins, and these are used singly or in combinations of two or more.

The thermosetting polyurethane resin may be synthesized by a common method, or procured as a commercially available product.

The resin sheet 110, preferably, contains an isocyanate group-containing compound as a main component, and has the polished surface S capable of abutting a surface to be polished (surface to be processed) of a polishing workpiece during lapping processing. The resin sheet 110 is formed by subjecting a thermosetting polyurethane resin molded body formed from a mixed liquid of an isocyanate group-containing compound and an active hydrogen compound to a slicing treatment and a surface grinding treatment such as buffing.

The thickness of the resin sheet 110 according to the present embodiment is not especially limited, but is preferably 0.5 to 20.0 mm. When the thickness is the above lower limit value or more, the effect of elongating the life of the resin plate can be attained more effectively and securely; and when the thickness is the above upper limit value or less, the handling becomes easy more effectively and securely.

The opening rate of the resin sheet 110 according to the present embodiment is 10 to 50%, preferably 10 to 45%, and more preferably 15 to 40%. When the opening rate is 10% or more, since the amount of a polishing slurry (hereinafter, simply also referred to as "slurry") containing diamond abrasive grains retained on the resin sheet 110 can be raised, the lapping rate is enabled to be improved. On the other hand, when the opening rate is 50% or less, since the proportion taken by openings in the polished surface S of the resin sheet 110 can be suppressed, the area of portions (where the resin is present) in the polished surface S contributing to polishing can be made large, and the lapping rate is resultantly enabled to be raised. The opening rate of the resin sheet 110 is, particularly from the viewpoint of further improving the lapping rate, preferably 20% or more, and more preferably 25% or more.

The opening rate of the resin sheet 110 can be controlled, for example, by adjusting the kinds and amounts of materials to form openings (a foaming agent, a dispersion liquid, a micro hollow spherical body and the like). The opening rate of the resin sheet 110 is measured as follows. That is, first, a rectangular region of 1.0 mm×1.4 mm optionally selected from the polished surface S of the resin sheet 110 is observed at an enlarged magnification of 200× by a laser microscope (for example, trade name: "VK-X105", made by KEYENCE Corp.) to thereby acquire its image. Then, the acquired image is subjected to a binarization process using image analysis software (for example, trade name: "WinRoof", made by MITANI CORPORATION) to thereby distinguish between openings and portions excluding the openings. Then, the sum total of the area of the distinguished opening potions is divided by the observed areal range and multiplied by 100 to thereby acquire an opening rate (%).

The average opening diameter of the resin sheet 110 according to the present embodiment is preferably 10 to 80 µm, more preferably 15 to 55 µm, still more preferably 20 to 55 µm, and especially preferably 20 to 50 µm. When the average opening diameter is 15 µm or more, since the amount of the slurry containing the diamond abrasive grains retained on the resin sheet 110 is easily raised, the lapping rate is enabled to be improved. On the other hand, when the average opening diameter is 55 μm or less, since large openings are scarcely present on the polished surface S of the resin sheet 110, the polishing quality can be more enhanced such as improving the flatness of a polishing workpiece surface and reducing the polishing unevenness. When the average opening diameter is in the above range, since the slurry can be more sufficiently supplied to a polishing workpiece, the lapping burn, in which the heat generation would be caused by lack of the slurry and the like during lapping to discolor the polished surface (lapping surface) S of the resin sheet 110 and change the texture, structure and material property, can be suppressed to be thereby able to improve the surface roughness of the polishing workpiece. The average opening diameter of the resin sheet 110 is, particularly from the viewpoint of more improving the lapping rate, preferably 50 to 80 μm, and more preferably 55 to 70 μm. The average opening diameter of the resin sheet 110 can be controlled, for example, by adjusting the degree of stirring (for example, the number of stirring rotation) and the temperature in the reaction (crosslinking curing) described later. Here, the average opening diameter of the resin sheet 110 is measured as follows. That is, first, as in the case of deriving the opening rate, an image of the polished surface S of the resin sheet 110 is acquired, and openings and portions excluding the openings are distinguished. Then, an equivalent circle diameter is calculated from an area of each distinguished opening, that is, an opening diameter is calculated by assuming that the opening is a true circle. Then, the opening diameters (excluding opening diameters of less than 10 μm) of the openings are arithmetically averaged to thereby determine an average opening diameter (μm).

The Young's modulus of the resin sheet 110 according to the present embodiment is $7.0 \times 10^7$ to $5.0 \times 10^8$ N/m². When the Young's modulus is $7.0 \times 10^7$ N/m² or more, since the complete embedding of diamond abrasive grains in the resin sheet 110 can be suppressed and the diamond abrasive grains can be suitably partially protruded from the polished surface of the resin sheet 110, lapping is enabled to be well carried out, and the lapping rate can be raised. On the other hand, when the Young's modulus is $5.0 \times 10^8$ N/m² or less, since the excessive protrusion of diamond abrasive grains from the polished surface can be prevented, the generation of scratches on a polishing workpiece by some excessively protruding diamond abrasive grains can be suppressed. Further since the diamond abrasive grains can be retained well, the generation of scratches in a polishing workpiece along with the tumbling motion of the diamond abrasive grains is also enabled to be suppressed. The Young's modulus of the resin sheet 110 is, particularly from the viewpoint of more suppressing the generation of scratches on a polishing workpiece, preferably $7.0 \times 10^7$ to $3.0 \times 10^8$ N/m², more preferably $8.5 \times 10^7$ to $2.5 \times 10^8$ N/m², still more preferably $1.0 \times 10^8$ to $2.0 \times 10^8$ N/m², and especially preferably $1.1 \times 10^8$ to $1.8 \times 10^8$ N/m². Further the Young's modulus of the resin sheet 110 is, particularly from the viewpoint of further raising the lapping rate, preferably $2.5 \times 10^8$ to $5.0 \times 10^8$ N/m², more preferably $3.0 \times 10^8$ to $5.0 \times 10^8$ N/m², still more preferably $3.3 \times 10^8$ to $4.8 \times 10^8$ N/m², and especially preferably $3.5 \times 10^8$ to $4.5 \times 10^8$ N/m².

The Young's modulus of the resin sheet 110 can be controlled, for example, by adjusting the equivalent weight (for example, the NCO equivalent weight of an isocyanate-terminated urethane prepolymer) of resins to be used and the density of the resin sheet 110. The Young's modulus of the resin sheet 110 is measured as follows. That is, first, a part of the resin sheet 110 (10 mm×30 mm, the thickness is the same as that of the resin sheet 110) is prepared as a test piece, and set on a predetermined position of a micro strength evaluation tester (for example, trade name: "Micro Autograph MST-I", made by SHIMADZU CORPORATION). Then, the measurement is carried out at room temperature and at a test speed of 1.5 mm/min to thereby determine strains. At this time, respective displacements at tensile loads in the range of 10 gf to 100 gf are determined, and a Young's modulus (N/m²) is determined from a coefficient of a straight line acquired by approximation using the method of least squares.

The resin sheet 110 according to the present embodiment has a Shore D hardness of preferably 40 to 70, and more preferably 45 to 60. When the Shore D hardness is 40 or more, the lapping rate can be more raised and the generation of roll-off (outer peripheral sag) of a polishing workpiece caused by lapping processing can be prevented effectively and securely. On the other hand, when the Shore D hardness is 70 or less, the generation of scratches can be suppressed more effectively. The Shore D hardness of the resin sheet 110 can be controlled, for example, by adjusting the equivalent weight (the NCO equivalent weight of an isocyanate-terminated urethane prepolymer) of a resin. The Shore D hardness is measured according to JIS-K6253 (2012). The Shore D hardness of the resin sheet 110 is, particularly from the viewpoint of more suppressing the generation of scratches, preferably 65 or less, more preferably 58 or less, and still more preferably 53 or less. Further the Shore D hardness of the resin sheet 110 is, particularly from the viewpoint of more raising the lapping rate, preferably 57 or more, and more preferably 62 or more.

The compressibility of the resin sheet 110 according to the present embodiment is preferably 1.5% or less, and more preferably 1.2% or less. When the compressibility is the above upper limit value or less, the lapping rate can be more raised and the roll-off can be reduced more effectively and securely. The compressibility of the resin sheet 110 is, particularly from the viewpoint of further improving the lapping rate, preferably 0.5% or more, more preferably 0.8% or more, and still more preferably 0.9% or more. The compressibility of the resin sheet 110 can be controlled, for example, by adjusting the NCO equivalent weight of an isocyanate-terminated urethane prepolymer and/or the porosity.

The density (bulk density) of the resin sheet 110 according to the present embodiment is preferably 0.50 to 1.15 g/cm³, more preferably 0.65 to 1.05 g/cm³, and still more preferably 0.70 to 1.00 g/cm³. When the density is 0.55 g/cm³ or more, since the complete embedding of diamond abrasive grains in the resin sheet 110 is more suppressed and moreover, the protruding heights of the diamond abrasive grains from the polished surface of the resin sheet 110 can be made uniform, lapping is enabled to be better carried out and the lapping rate can be further raised. On the other hand, when the density is 1.15 g/cm³ or less, since the excessive protrusion of diamond abrasive grains from the polished surface can more effectively be prevented, the generation of scratches on a polishing workpiece and of a damaged layer by some excessively protruding diamond abrasive grains can be further suppressed. Further since the diamond abrasive grains can be better fixed and retained, the generation of scratches on a polishing workpiece along with tumbling motion of the diamond abrasive grains is enabled to be further suppressed. The density of the resin sheet 110 can be determined by using the resin sheet 110 cut out into a predetermined size as a test piece, and from the mass and the size (volume) of the test piece.

Grooves 130 are formed on the polished surface S. The grooves 130 are installed in order to more effectively and securely detain diamond abrasive grains on the polished surface S and more securely discharge polishing sludge generated in lapping processing. Examples of the planar shape (shape viewed from the upper side of FIG. 1) of the grooves 130 include spiral shapes, concentric shapes, radial shapes and lattice shapes, and may be combinations of two or more thereof. Among these, the planar shape is preferably a spiral shape from the viewpoint that diamond abrasive grains supplied are more efficiently dispersed on the whole polished surface S of a resin plate 100, and from the viewpoint that the polishing sludge is more speedily discharged outside the system. The cross-sectional shape of the grooves 130 may be a V shape as shown in FIG. 1, or may be a rectangular shape, a U shape or a semicircular shape.

The depth of the grooves 130 is preferably 50 to 80% of the thickness of the resin sheet 110, and more preferably 60 to 80% thereof. When the depth of the grooves 130 is the above lower limit value or more, the circulation property of a polishing slurry is enabled to be improved, and also the life of a resin plate is enabled to be improved; and when the depth is the above upper limit value or less, the effect of maintaining the strength can be attained more effectively and securely. The width of the grooves 130 is preferably 0.3 to 3.0 mm, and more preferably 0.5 to 2.0 mm. Further the pitch (distance in the width direction between the adjacent grooves) of the grooves 130 is preferably 0.6 to 6.0 mm, and more preferably 1.0 to 4.0 mm. These depth, width and pitch of the grooves 130 may be each constant or partially different in the same polishing plate 100.

Since the resin sheet 110 is made of a resin, the grooves 130 can easily be formed into a desired pattern and shape by common cutting processing and the like.

Diamond abrasive grains 120 are embedded from the polished surface S side in the resin sheet 110, and at least part of the diamond abrasive grains 120 are exposed from the polished surface S. The diamond abrasive grains 120 are not especially limited as long as being ones being used in usual diamond lapping processing, and include natural or artificial single crystal diamonds and polycrystalline diamonds. The shape of the diamond abrasive grains 120 is not especially limited; and the average grain diameter of the diamond abrasive grains 120 is not also especially limited, but is preferably 1.0 to 10.0 µm, and more preferably 1.5 to 5.0 µm. When the average grain diameter of the diamond abrasive grains 120 is the above lower limit value or more, while the embedding of the diamond abrasive grains 120 is more suppressed, the improvement of the polishing rate and the surface quality can simultaneously be attained; and when the average grain diameter is the above upper limit value or less, since the protrusion amount of the diamond abrasive grains 120 does not become excessive, the decrease of the surface quality of a polishing workpiece due to the generation of scratches and the like on the surface of the polishing workpiece can be more suppressed. The embedding amount of the diamond abrasive grains 120 in the resin plate 100 may suitably be adjusted according to the material of a polishing workpiece and a necessary degree of polishing.

A resin plate 100 according to the present embodiment is manufactured, for example, as follows. That is, one example of a manufacturing method of a resin plate 100 according to the present embodiment comprises a raw material preparation step of preparing an isocyanate group-containing compound and an active hydrogen compound each, a mixing step of mixing the isocyanate group-containing compound and the active hydrogen compound to thereby prepare a mixed liquid, a casting step of casting the mixed liquid in a mold, a curing and molding step of forming a thermosetting polyurethane molded body in the mold, a surface treatment step of subjecting the thermosetting polyurethane molded body to a slicing treatment and/or a surface grinding treatment, and a groove formation step of forming grooves on the thermosetting polyurethane molded body after the surface treatment.

(Raw Material Preparation Step)

In the raw material preparation step, an isocyanate group-containing compound and an active hydrogen compound as raw materials of a thermosetting polyurethane resin are each prepared. The isocyanate group-containing compound is preferably an isocyanate-terminated urethane prepolymer (hereinafter, simply abbreviated to "prepolymer") produced by reacting a polyol compound having two or more hydroxyl groups in its molecule with a diisocyanate compound having two isocyanate groups in its molecule. In the reaction of the polyol compound with the diisocyanate compound, by making the molar amount of the isocyanate group to be larger than the molar amount of the hydroxyl group, the prepolymer can be obtained.

Examples of the diisocyanate compound to be used for the production of the prepolymer include m-phenylene diisocyanate, p-phenylene diisocyanate, 2,6-tolylene diisocyanate (2,6-TDI), 2,4-tolylene diisocyanate (2,4-TDI), naphthalene-1,4-diisocyanate, diphenylmethane-4,4'-diisocyanate, 3,3'-dimethoxy-4,4'-biphenyl diisocyanate, 3,3'-dimethyldiphenylmethane-4,4'-diisocyanate, xylylene-1,4-diisocyanate, 4,4'-diphenylpropane diisocyanate, trimethylene diisocyanate, hexamethylene diisocyanate (HDI), propylene-1,2-diisocyanate, butylene-1,2-diisocyanate, cyclohexylene-1,2-diisocyanate, cyclohexylene-1,4-diisocyanate, dicyclohexylmethane-4,4'-diisocyanate (hydrogenated MDI), p-phenylene diisothiocyanate, xylylene-1,4-diisothiocyanate and ethylidyne diisothiocyanate. These are used singly or in combinations of two or more.

On the other hand, the polyol compound to be used for the production of the prepolymer may be a compound having a plurality of hydroxyl groups such as a diol compound or a triol compound, and examples thereof include low-molecular weight polyol compounds such as ethylene glycol, butylene glycol, hexanediol and trimethylolpropane, (poly)ether polyol compounds such as diethylene glycol and polytetramethylene ether glycol (PTMG), (poly)ester polyol compounds such as reaction products of ethylene glycol with adipic acid, and reaction products of butylene glycol with adipic acid, and high-molecular weight polyol compounds such as (poly) carbonate polyol compounds and (poly)caprolactone polyol compounds. These are used singly or in combinations of two or more.

The NCO equivalent weight (isocyanate equivalent weight) of the prepolymer is preferably 190 to 500, and more preferably 300 to 500. When the NCO equivalent weight is adjusted in this range, since a suitable elasticity can be imparted to the resin sheet 110, the embedding of the diamond abrasive grains 120 becomes easier and the liberation thereof is more suppressed.

The active hydrogen compound may have an active hydrogen group reactive with terminal isocyanate groups of the prepolymer, and examples thereof include polyamine compounds and polyol compounds. An active hydrogen compound reacts with isocyanate groups of a prepolymer to thereby form a hard segment (urethane bond moiety having a high melting point and imparting a rigidity). Examples of the polyamine compound include ethylenediamine, propylenediamine, hexamethylenediamine, isophoronediamine, dicyclohexylmethane-4,4'-diamine, 3,3'-dichloro-4,4'-diaminodiphenylmethane (hereinafter, abbreviated to "MOCA") and polyamine compounds having a structure similar to that of MOCA. Alternatively, the polyamine compound may have hydroxyl groups, and examples of such a compound include 2-hydroxyethylethylenediamine, 2-hydroxyethylpropylenediamine, di-2-hydroxyethylethylenediamine, di-2-hydroxyethylpropylenediamine, 2-hydroxypropylethylenediamine and di-2-hydroxypropylethylenediamine.

On the other hand, the polyol compound may be a compound having a plurality of hydroxyl groups such as a diol compound and a triol compound, and examples thereof include low-molecular weight polyol compounds such as ethylene glycol, butylene glycol, and hexanediol, (poly)ether polyol compounds such as polypropylene glycol, (poly)ester polyol compounds such as reaction products of ethylene glycol with adipic acid, and reaction products of butylene glycol with adipic acid, and high-molecular weight polyol compounds such as polycarbonate polyol compounds and polycaprolactone polyol compounds. As the active hydrogen compound, at least one of the polyamine compound and the polyol compound may be used, and two or more of the polyamine compounds and polyol compounds may be concurrently used.

Among these active hydrogen compounds, MOCA is preferable from the viewpoint of more effectively and securely achieving the object of the present invention. Here, as MOCA, solid MOCA and crude MOCA are known. The solid MOCA means a pure MOCA in a solid shape at room temperature. The crude MOCA is a mixture of a monomer of MOCA and multimers of MOCA, and a crude MOCA preferably having a ratio of multimers of 15% by mass or more is used. The ratio of the multimers is more preferably 10 to 50% by mass, and still more preferably 20 to 40% by mass. Examples of the multimers include a dimer, a trimer and a tetramer of MOCA. The crude MOCA is easy in the control of the reaction velocity, and as a result, the uniformity of physical properties (for example, the density and the hardness) of a whole foamed body is easily attained.

In the present description, the cases of using terms of "solid MOCA" and "crude MOCA" mean the above solid MOCA and crude MOCA, respectively.

As required, a dispersion liquid may be prepared as a raw material. The dispersion liquid is for adjusting the foaming state in the resin sheet 110, and is used for controlling the foam diameter and the foam uniformity of foams (for example, openings of the polished surface S and bubbles present in the interior of the resin sheet 110) present in the resin sheet 110. Therefore, the dispersion liquid is not especially limited as long as being one capable of achieving such an object. For example, the dispersion liquid may be one containing water, a catalyst and a surfactant, or may further contain, as required, the above active hydrogen compound, a flame retardant, a colorant, a plasticizer and the like.

Water contained in a water-dispersion liquid is preferably distilled water from the viewpoint of preventing the mingling of impurities. The amount of water used is, with respect to 1000 parts by mass of the prepolymer, preferably 0.1 to 6 parts by mass, more preferably 0.5 to 5 parts by mass, and still more preferably 1 to 3 parts by mass.

The catalyst is not especially limited as long as being one promoting the urethanization reaction, and may be a well-known one, and examples thereof include amine-based catalysts such as tertiary amines, alcohol amines and ether amines, acetate salts (potassium, calcium) and organometal catalysts. The amount of the catalyst used is, with respect to 1000 parts by mass of the prepolymer, preferably 0.01 to 5 parts by mass, and more preferably 0.5 to 3 parts by mass.

The surfactant may be any of anionic, cationic, amphoteric and nonionic surfactants, and may be a fluorine-based or silicone-based surfactant. The surfactant more specifically includes polyether-modified silicones. The amount of the surfactant used is, with respect to 1000 parts by mass of the prepolymer, preferably 0.1 to 10 parts by mass, and more preferably 0.5 to 7 parts by mass.

As required, a micro hollow spherical body may be prepared as a raw material. Also the use of the micro hollow spherical body forms openings originated from the micro hollow spherical body on the polished surface S of the resin sheet 110, and can contribute to the lapping processing by nearly uniformly moving on the surface to be polished of a polishing workpiece while the slurry supplied in the lapping processing is retained in the openings. That is, since the dispersion and supply of the slurry is made uniform, the lapping properties such as the lapping efficiency and accuracy can be stabilized. The use further raises the independent porosity of the resin sheet 110 to be thereby able to suppress the permeation of the slurry and polishing sludge into the pad interior and prevent the generation of scratches due to the aggregation and the solidification of abrasive grains and the polishing sludge.

The micro hollow spherical body refers to one obtained by thermally expanding an unfoamed thermally expandable micro spherical body composed of an outer shell (polymer shell) composed of a thermoplastic resin and a low-boiling point hydrocarbon included in the outer shell. Examples of the polymer shell include, as disclosed in Japanese Patent Laid-Open No. 57-137323, thermoplastic resins such as an acrylonitrile-vinylidene chloride copolymer, an acrylonitrile-methyl methacrylate copolymer and a vinyl chloride-ethylene copolymer. Likewise, examples of the low-boiling point hydrocarbon included in the polymer shell include isobutane, pentane, isopentane and petroleum ether. The unfoamed thermally expandable micro spherical body more specifically includes ones (trade name: "EXPANCEL 461DE" (particle diameter: 20 to 40 µm), trade name: "EXPANCEL 551DE" (particle diameter: 30 to 50 µm), made by Akzo Nobel Pulp and Performance Chemicals AB Expancel) in which a polymer shell part is composed of an acrylonitrile-vinylidene chloride copolymer, and isobutane gas is included in the shell. The particle diameter of the micro hollow spherical body is not especially limited, and may suitably be adjusted so that the resin sheet 110 has the above physical properties.

The amount of the micro hollow spherical body used is, from the viewpoint that the hardness and the elasticity of the resin sheet 110 are made to fall in predetermined ranges, with respect to 100% by mass of all the raw materials, preferably 1 to 10% by mass, and more preferably 2 to 4% by mass.

Other than all the above raw materials, a foaming agent used for resin sheets in conventional polishing pads may further be used in the range not inhibiting the achievement of the object of the present invention. Examples of the foaming agent include water, and foaming agents containing as a main component a hydrocarbon having 5 or 6 carbon atoms. Examples of the hydrocarbon include chain hydrocarbons such as n-pentane and n-hexane, and alicyclic hydrocarbons such as cyclopentane and cyclohexane.

(Mixing Step, Casting Step, Curing and Molding Step)

In the mixing step, the isocyanate group-containing compound and the active hydrogen compound prepared in the preparation step, and as required, the dispersion liquid, the micro hollow spherical body, the foaming agent and the like are mixed to thereby prepare a mixed liquid. At this time, the active hydrogen compound, for example, MOCA, in the state of being previously dissolved in an organic solvent is preferably mixed with the isocyanate group-containing compound. When the active hydrogen compound is mixed in the state of being previously dissolved in an organic solvent, since the flowability is raised even without being heated, the mixing unevenness can be more suppressed. The organic solvent is not especially limited as long as being a good solvent for MOCA and the like, but examples thereof include diol compounds such as (poly)ether polyol compounds, (poly)ester polyol compounds such as reaction products of ethylene glycol with adipic acid, and reaction products of butylene glycol with adipic acid, and polycarbonate polyol compounds and polycaprolactone polyol compounds. Use of a diol compound is preferable because the bond with a prepolymer easily makes a urethane bond, whose molecular bond is relatively weak (for example, being weaker than the urea bond), and diamond abrasive grains 120 are easily embedded in the resin sheet 110. An especially preferable example among the diol compounds includes polypropylene glycol. The blend ratio of an organic solvent and an active hydrogen compound is, in mass ratio of the organic solvent:the active hydrogen compound, preferably 40:60 to 60:40, and more preferably 45:55 to 55:45. Further in the mixing step, a non-reactive gas (for example, air) may be blown in the each raw material.

In the casting step, the mixed liquid prepared in the mixing step is cast in a mold. Further in the curing and molding step, the isocyanate group-containing compound and the active hydrogen compound in the mixed liquid are reacted and cured in the mold to thereby mold a block-shape thermosetting polyurethane molded body. At this time, the isocyanate group-containing compound is crosslinkingly cured by the reaction with the active hydrogen compound. The temperature at this time may suitably be controlled, for example, so as to make a desired average opening diameter, and may be 50 to 120° C.

The content proportion of the isocyanate group-containing compound in the mixed liquid is not especially limited, but is, from the viewpoint of more effectively and securely attaining the advantage of the present invention and from the viewpoint of further suppressing the mixing unevenness, with respect to the total amount of the isocyanate group-containing compound and the active hydrogen compound, preferably 20.0 to 60.0% by mass, and more preferably 25.0 to 50.0% by mass.

These mixing step, casting step and curing and molding step may be carried out continuously by using apparatuses conventionally known for molding polyurethane molded bodies.

(Surface Treatment Step)

In the surface treatment step, the thermosetting polyurethane molded body obtained through the curing and molding step is subjected to a slicing treatment and/or a surface grinding treatment such as a buffing treatment. In the slicing treatment, a common slicing machine can be used. In the slicing treatment, for example, a rectangular parallelepiped-shape thermosetting polyurethane molded body is held on its one surface side, and is sliced into a predetermined thickness successively from the surface side opposing to the one surface. The thickness to be sliced is preferably the same as that of the resin sheet 110. In order to improve the accuracy of the thickness of the resin sheet 110, the thermosetting polyurethane molded body or the thermosetting polyurethane molded body after the slicing treatment may be subjected to a surface grinding treatment such as a buffing treatment. In the buffing treatment, a common buffing machine can be used.

(Groove Formation Step)

In the groove formation step, grooves 130 are formed on the surface of the thermosetting polyurethane molded body after the surface treatment step. A processing method to be used in the formation of the grooves 130 may be a commonly known processing method of forming grooves on the surface of thermosetting polyurethane molded bodies, and an example thereof includes cutting processing. For example, in the case where a cutting processing is carried out, the cutting processing may be carried out so as to make a desired planar shape on the thermosetting polyurethane molded body by rotating and moving a drill cutting edge parallelly relatively to the surface of the thermosetting polyurethane molded body, or by rotating and moving a circular disc cutting edge perpendicularly relatively to the surface of the thermosetting polyurethane molded body. Alternatively, the cutting processing may be carried out by moving a cutting tool relatively to the surface of the thermosetting polyurethane molded body. In these cases, by suitably selecting a shape of the drill cutting edge or the circular disc cutting edge, a desired cross-sectional shape can be obtained. Alternatively, by using a laser, grooves having a desired planar shape and cross-sectional shape can also be formed on the surface of the thermosetting polyurethane molded body.

Thereby, a resin plate 100 according to the present embodiment in which the grooves 130 are formed on the surface of the thermosetting polyurethane molded body is obtained. The resin sheet 110 may be cut so as to have a desired planar shape before or after the above groove formation step. Here, before a polishing workpiece is subjected to lapping processing by using the resin plate 100, the resin plate 100 may be provided with a pressure-sensitive adhesive layer by laminating a double-sided tape on the surface on the opposite side to the polished surface S of the resin plate 100, or may be provided with an adhesive layer by applying an adhesive agent thereon. These pressure-sensitive adhesive layer and adhesive layer are for installing the resin plate 100 on a lapping apparatus.

Then, one example of a lapping method using the resin plate 100 according to the present embodiment will be described. The lapping method is a method of subjecting a polishing workpiece to lapping processing in the presence of diamond abrasive grains 120 by using the resin plate 100.

The lapping method preferably comprises an abrasive grain-embedding step in which diamond abrasive grains 120 are embedded in the resin plate 100, before lapping processing. In the abrasive grain-embedding step, the diamond abrasive grains 120 are embedded in the resin plate 100 from the surface of the resin plate 100 on the side on which the grooves 130 have been formed, that is, from the surface side to become the polished surface S. An example of an embedding method includes a method in which after the diamond abrasive grains 120 are sprayed so as to be in a desired spraying amount on the above surface of the resin plate 100, the diamond abrasive grains 120 mounted on the above surface of the resin plate 100 are pressed at a predetermined pressure toward the direction of the resin plate 100 to thereby embed (charge) the abrasive grains, and may be a method described in, for example, Japanese Patent Application Laid-Open No. 2007-61961. An example of means to be used for the pressing includes a retainer ring. The spraying of the diamond abrasive grains 120 may be carried out by spraying the diamond abrasive grains 120 singly, but from the viewpoint of preventing the aggregation of the plurality of diamond abrasive grains 120, the spraying is preferably carried out by applying the diamond abrasive grains 120 in the state of being dispersed with a dispersant. The dispersant may be a liquid to be used for a usual diamond abrasive grain dispersion liquid or a polishing slurry containing diamond abrasive grains, and an example thereof includes a mixed liquid of glycerol and water.

The abrasive grain-embedding step may be provided before a polishing workpiece is subjected to lapping processing by using the resin plate 100, but may be provided in the lapping processing step. In the case where the embedding of abrasive grains is carried out together with lapping processing, the diamond abrasive grains 120 can be embedded by pressing the diamond abrasive grains 120 on the resin plate 100 toward the resin plate 100 by the polishing workpiece while a polishing slurry containing the diamond abrasive grains 120 is supplied on the resin plate 100.

Although the diamond abrasive grains 120 are previously embedded in the polished surface S of the resin plate 100, in addition thereto, the diamond abrasive grains 120 may be newly supplied in lapping processing and embedded in the polished surface S of the resin plate 100, or may be newly supplied and free (free ones without being embedded in the polished surface of the resin plate 100, and/or ones, though having been once embedded in the polished surface S, liberated thereafter). As a result of these, as compared with a plate of a fixed abrasive grain type in which diamond abrasive grains are internally added in a resin interior, diamond abrasive grains can be fixed densely only on the polishing surface in a high grinding power state, and also the surface quality of a polishing workpiece can be enhanced while the polishing rate is raised.

In the lapping method, first, the resin plate 100 is installed on a predetermined position of a lapping apparatus. At this installation, the resin plate 100 is installed so as to be fixed on the lapping apparatus through the above-mentioned pressure-sensitive adhesive layer or adhesive layer. Then, a polishing workpiece held on a holding plate arranged so as to face the resin plate 100 as a lapping plate is pressed against the polished surface S, and the resin plate 100 and/or the holding plate is rotated while the polishing slurry containing the diamond abrasive grains is supplied from the outside. Thereby, the surface to be processed (surface to be polished) of the polishing workpiece is subjected to lapping processing by the action of the diamond abrasive grains 120 supplied between the resin plate 100 and the polishing workpiece and embedded in the resin sheet 110 of the resin plate 100. At this time, grooves shallower than the grooves 130 may be formed on the polished surface S of the resin sheet 110 by sliding of the free diamond abrasive grains 120 on the resin sheet 110 of the resin plate 100.

The polishing slurry contains the diamond abrasive grains and the dispersant to disperse the diamond abrasive grains. The content proportion of the diamond abrasive grains in the polishing slurry is not especially limited, but is preferably 0.01 to 1.0% by mass with respect to the total amount of the polishing slurry from the viewpoint of more effectively carrying out the lapping processing and suppressing the thickening of a damaged layer in a polishing workpiece.

Examples of the dispersant include water and organic solvents. Organic solvents are preferable from the viewpoint of more suppressing the deterioration of a polishing workpiece. As the organic solvents, hydrocarbons are preferable and hydrocarbons having a high boiling point are more preferable. Examples of the hydrocarbons include paraffinic hydrocarbons, olefinic hydrocarbons, aromatic hydrocarbons and alicyclic hydrocarbons. Examples of the hydrocarbons having a high boiling point include petroleum-based hydrocarbons having an initial boiling point of 220° C. or more. The solvents are used singly or in combinations of two or more. Further, the solvent may contain other additives in the range not inhibiting the achievement of the object of the present invention. Examples of such additives include polar compounds, and specifically include nonionic surfactants, anionic surfactants, carboxylate esters, carboxylic acid amides and carboxylic acids.

Here, from the viewpoint of suppressing the temperature rise involved in the friction between the resin plate 100 and a polishing workpiece in lapping processing, a solvent which contains no abrasive grains and may contain additives may suitably be supplied to the polished surface S of the resin plate 100. Examples of the solvent and the additives are those cited in the above.

A polishing workpiece is not especially limited as long as being one conventionally subjected to lapping processing, and examples thereof include semiconductor wafers, magnetic discs and optical glasses. Among these, semiconductor wafers are preferable and SiC substrates or GaN substrates are preferable, from the viewpoint of being able to make more effective use of the action and effect of the resin plate 100 according to the present embodiment. As their materials, difficult-to-grind materials such as SiC single crystals and GaN single crystals are preferable, but their materials may be single crystals of sapphire or silicon nitride, or the like.

According to the present embodiment, the resin plate 100 as a lapping plate, since being softer than metal-based plates, can be embedded easily in a short time with the diamond abrasive grains 120 from the polished surface S side, and since being richer in elasticity than metal-based plates, can retain firmly the embedded diamond abrasive grains 120 by its elasticity. Further, even when the free diamond abrasive grains 120 are ones not embedded in the resin sheet 110, the free diamond abrasive grains 120 are squeezed in the resin sheet 110 side rather than a polishing workpiece side by the elasticity of the resin sheet 110. Hence, the tumbling motion of the free diamond abrasive grains 120 and the high protrusion of part of the diamond abrasive grains 120 embedded in the resin sheet 110 from the polished surface S side of the resin plate 100 can be suppressed. Further even if the pressing force of the resin plate 100 to a polishing workpiece becomes partially high and nonuniform, since the resin sheet 110 becomes good in conformity to the polishing workpiece due to its elasticity, the degree of the nonuniformity can be weakened. As a result of these, since the diamond abrasive grains 120 are enabled to be made to abut the polishing workpiece wholly uniformly, the lapping rate is raised and the generation of scratches on the polishing workpiece is enabled to be reduced. Particularly since the conformity to irregularities of the polishing workpiece surface is good, the polished surface S of the resin sheet 110 abuts not only projections but also recessions at a suitable pressure. As a result, since lapping of the projections and also lapping of the recessions (though the lapping rate becomes low as compared with that of the projections) advance, chipping of the projections, which would occur in the case where only the projections are selectively lapped, is enabled to be suppressed.

Further the tumbling motion of the diamond abrasive grains 120 can be suppressed and the polishing surface is renewed into the state of always fixing the abrasive grains due to the abrasibility of the resin plate 100 itself; as a result, the processing efficiency of the resin plate 100 is enabled to be maintained better. Further since the protruded portions of the diamond abrasive grains embedded in the resin sheet 110 do not become so high, the generation of the so-called damaged layer can also be suppressed.

Further according to the present embodiment, the resin plate 100 is lighter than metal-based plates conventionally used in lapping processing. Whereas the specific gravity (true specific gravity) of a metal, for example, iron, copper and tin, is 7.87, 8.96 and 7.29, respectively, the specific gravity of a thermosetting polyurethane resin is very as light as, for example, about 1.0 to 1.3. Hence, the handling of a plate is very easy. For example, not only the resin plate 100 is mounted on a predetermined position of a lapping apparatus and fixed from the underside, but also the resin plate 100 can be fixed from the upside. Thereby, a polishing workpiece is subjected not only to lapping processing from the underside only, but also, in place thereof or in addition thereto, can be subjected to lapping processing from the upside. Although the metal-based plates need to be installed on a lapping apparatus by using screwing or the like, the resin plate 100 can be installed by using a double-sided tape or an adhesive agent as described above, which also makes the handling easy.

Further a copper or tin plate, though being relatively soft among metal-based plates, comes to be easily deformed in the case of being heated at 40° C. or more by the friction between the lapping plate and a polishing workpiece in lapping processing. By contrast, the resin plate 100 according to the present embodiment, since being a thermosetting polyurethane resin having a higher heat resistance than the metals, is hardly deformed even if being heated by the above friction in lapping processing.

Further in the lapping processing using the resin plate 100 according to the present embodiment, the diamond abrasive grains 120 can suitably be supplied to the resin plate 100 during the lapping processing. Hence, when the diamond abrasive grains 120 are used for lapping processing, even if the diamond abrasive grains 120 are discharged as processing sludge together with polishing sludge, since fresh diamond abrasive grains 120 are enabled to be supplied to the resin plate 100, the uniform flatness of the polished surface of the polishing workpiece can further be enhanced particularly without suspending the lapping processing.

Hitherto, an embodiment to carry out the present invention has been described, but the present invention is not limited to the above present embodiment. Various changes and modifications may be made in the present invention in the scope of not departing from its gist.

EXAMPLES

Hereinafter, the present invention will be described in more detail by way of Examples, but the present invention is not limited to these Examples. Here, the density was measured as described above, and the measurements of the respective physical properties other than this and the evaluation of the lapping processing performance were carried out as follows.
(Measurements of the Compressibility and the Compressive Modulus)

The compressibility and the compressive modulus of the resin sheet were determined according to JIS-L1021 by using a Schopper-type thickness gauge (pressing surface: a circle of 1 cm in diameter). Specifically, at room temperature, the thickness $t0$ of the resin sheet after 30 sec of an applied initial load from a load-free state was measured; the thickness $t1$ of the resin sheet after the resin sheet was impressed with a final pressure from the state of the thickness of $t0$, and left as it was for 1 min was then measured; and after the resin sheet was relieved from all the load from the state of the thickness of $t1$, and left for 1 min, the thickness $t0'$ of the resin sheet after the resin sheet was again impressed with the initial load for 30 sec was measured. From these, the compressibility and the compressive modulus were calculated by the following expressions:

Compressibility (%)=$(t0-t1)/t0 \times 100$

Compressive modulus (%)=$(t0'-t1)/(t0-t1) \times 100$

At this time, the initial load was 300 g/cm², and the final pressure was 1800 g/cm².
(Measurement of the Shore D Hardness)

The Shore D hardness of the resin sheet was measured according to JIS-K6253 (2012) by using a hardness tester (trade name: "GS-702N", made by TECLOCK Corp.). Here, a test piece to be used was made by stacking the resin sheets at need so as to have a total thickness of 4.5 mm or more.
(Measurement of Opening Rate)

First, a rectangular region of 1.0 mm×1.4 mm optionally selected from the polished surface of the resin sheet was observed at an enlargement magnification of 200× by a laser microscope (trade name: "VK-X105", made by KEYENCE Corp.) to thereby acquire its image. Then, the acquired image was subjected to a binarization process using image analysis software (trade name: "WinRoof", made by MITANI CORPORATION) to thereby distinguish between openings and portions excluding the openings. Then, the proportion of the openings was calculated from ratios of the areas of the distinguished openings and portions excluding the openings to thereby acquire an opening rate (%).
(Measurement of the Average Opening Diameter)

An image of the polished surface of the resin sheet was acquired and the openings and portions excluding the openings were distinguished, as in the case where the opening rate was derived. Then, an opening diameter was calculated from the area of each distinguished opening by assuming that the opening was a true circle. Then, the opening diameters of the openings were arithmetically averaged to thereby acquire an average opening diameter (μm) (which was a numerical value when a "cutoff value" was set at 10 μm for noise-cut in the image process).
(Measurement of the Young's Modulus)

First, a test piece made into a strip shape of 10 mm×60 mm from a part of the resin sheet was prepared, and set on a predetermined position (a distance between clamps of 30 mm) of a micro strength evaluation tester (trade name: "Micro Autograph MST-I", made by SHIMADZU CORPORATION). Then, a tensile test was carried out at a test speed of 1.5 mm/min at room temperature to thereby acquire strains. At this time, respective strains were acquired for a plurality of test forces in the range of 10 gf to 100 gf, and a Young's modulus (N/m²) was determined from a coefficient linearly approximated by the method of least squares.
<Lapping Processing Test>

The resin plate was installed on a predetermined position of a lapping apparatus through an acrylic adhesive agent; and a 2″ 6H—SiC n-type wafer as a polishing workpiece was subjected to a lapping processing test which carried out lapping processing under the following condition. In the lapping processing test, first, while a dispersion liquid composed of 0.1% by mass of diamond abrasive grains (average grain diameter: 3 μm), and a mixed liquid (dispersant) of water and glycerol was applied on the surface of the resin plate, the applied resin plate was pressed for a predetermined time by a ceramic ring (retainer ring) to thereby embed the diamond abrasive grains in the resin plate, and then, lapping processing was carried out. The pressing time (charging time) of the ring was set for 1 hour for Comparative Example 3, and for 10 min for the other Examples and Comparative Examples.
(Lapping Condition)

Size of the plate in a lapping apparatus used: a diameter of 380 mm

Grooves: a width of 3 mm, a depth of 0.8 mm and a pitch of 30 mm; a planar shape of a lattice shape, a cross-sectional shape of a U shape Rotation frequency of the plate: 80 rpm Processing pressure: 245 g/cm²

Lapping processing time: 1 hour
(Scratches)

Scratches on the polished surfaces of 5 sheets of a polishing workpiece after the above lapping processing test were visually observed, and rated as "⊚", "○", "Δ" and "X" in order for from the case where the scratches were relatively few to the case where the scratches were relatively many.
(Lapping Rate)

A thickness of a polishing workpiece removed by the lapping processing was calculated from a polished amount determined from a mass loss of the polishing workpiece before and after the lapping processing, and a polished area and a specific gravity of the polishing workpiece; and the lapping rate (unit: μm/hr) was evaluated as the thickness removed per hour.
(Surface Roughness)

A polishing workpiece after the above lapping processing test was washed, and thereafter spin dried. Then, the surface roughness Ra corrected for the waviness of the polished surface of the polishing workpiece was measured by using a noncontact roughness tester (trade name: "NewView 5022", made by ZygoKK).
(Preparation of Prepolymers)

Three kinds of prepolymers were prepared as isocyanate group-containing compounds.
(Prepolymer 1)

556 parts by mass of a polytetramethylene ether glycol of about 1000 in number-average molecular weight, 54 parts by mass of diethylene glycol and 2 parts by mass of trimethylolpropane were used as polyol compounds, and 388 parts by mass of 2,4-tolylene diisocyanate was used as a diisocyanate compound; and these were allowed to react to thereby synthesize a terminal isocyanate group-containing urethane prepolymer having an NCO equivalent weight of 440. This was heated at 45° C. and defoamed under reduced pressure.
(Prepolymer 2)

284 parts by mass of a polytetramethylene ether glycol of about 1000 in number-average molecular weight and 64 parts by mass of diethylene glycol were used as polyol compounds, and 279 parts by mass of 2,4-tolylene diisocyanate was used as a diisocyanate compound; and these were allowed to react to thereby synthesize a terminal isocyanate group-containing urethane prepolymer having an NCO equivalent weight of 440. This was heated at 45° C. and defoamed under reduced pressure.
(Prepolymer 3)

675 parts by mass of a polytetramethylene ether glycol of about 1000 in number-average molecular weight was used as a polyol compound, and 325 parts by mass of 2,4-tolylene diisocyanate was used as a diisocyanate compound; and these were allowed to react to thereby synthesize a terminal isocyanate group-containing urethane prepolymer having an NCO equivalent weight of 420. This was heated at 80° C. and defoamed under reduced pressure.

Example 1

The solid MOCA was used as an active hydrogen compound, and heated and melted at 120° C., and further defoamed under reduced pressure to thereby obtain a solid MOCA melted liquid. 50 parts by mass of a polytetramethylene ether glycol of about 3000 in number-average molecular weight, 0.5 parts by mass of water, 0.7 parts by mass of a catalyst (trade name: "TOYOCAT ET", made by TOSOH CORPORATION), and 5 parts by mass of a silicone-based surfactant (trade name: "SH 193", made by Dow Corning Corp.) were stirred and mixed to thereby obtain a dispersion liquid. Then, the prepolymer 1, the solid MOCA melted liquid and the dispersion liquid in a proportion in mass ratio of 100:20:6, respectively, were fully stirred and mixed in a mixing tank to thereby obtain a mixed liquid. At this time, the stirring condition was such that the number of times of shearing was 2815 and the shearing speed was 15708/sec, and air was continuously supplied to the mixing tank at a flow volume of 10 L/min.

The obtained mixed liquid was cast in a mold whose internal space was a rectangular parallelepiped (size: 1200 mm×1200 mm×20 mm), and cured at 80° C. A formed thermosetting polyurethane molded body was extracted from the mold, and was subjected to a slicing treatment so as to have a thickness of 1.3 mm. Then, the thermosetting polyurethane molded body after the slicing treatment was cut out into a circular planar shape of 380 mm in diameter. Then, on the surface of the thermosetting polyurethane molded body after the cutting-out, grooves described in the above <lapping processing test> were formed by using a cutting tool to thereby obtain a resin plate.

Example 2

The mixed liquid in Example 1 was replaced by a mixed liquid obtained by fully stirring and mixing the prepolymer 1, the solid MOCA melted liquid and the dispersion liquid in a proportion in mass ratio of 100:20:5, respectively, in a mixing tank. A resin plate was obtained as in Example 1, except for the mixed liquid.

Example 3

The dispersion liquid in Example 1 was replaced by a micro hollow spherical body (trade name: "EXPANCEL 551DE", made by Akzo Nobel Pulp and Performance Chemicals AB Expancel), and the mixed liquid in Example 1 was replaced by a mixed liquid obtained by fully mixing the prepolymer 1, the solid MOCA melted liquid and the micro hollow spherical body in a proportion in mass ratio of 100: 25:2.3, respectively. A resin plate was obtained as in Example 1, except for the dispersion liquid and the mixed liquid.

Example 4

A liquid MOCA was used as an active hydrogen compound; and 100 parts by mass of the liquid MOCA, 0.01 parts by mass of water, 0.3 parts by mass of a catalyst (trade name: "TOYOCAT ET", made by TOSOH CORPORATION), and 0.3 parts by mass of a silicone-based surfactant (trade name: "SH 193", made by Dow Corning Corp.) were stirred and mixed to thereby obtain a dispersion liquid. Then, the prepolymer 1 and the dispersion liquid in a proportion in mass ratio of 100:62, respectively, were fully stirred and mixed in a mixing tank to thereby obtain a mixed liquid. At this time, the stirring condition was such that the number of times of shearing was 2815 and the shearing speed was 15708/sec, and air was continuously supplied to the mixing tank at a flow volume of 30 L/min. A resin plate was obtained as in Example 1, except for replacing the mixed liquid in Example 1 by the mixed liquid obtained as described above and altering the thickness of the resin plate from 1.3 mm to 2.28 mm.

Example 5

A liquid MOCA was used as an active hydrogen compound; and 100 parts by mass of the liquid MOCA, 0.01 parts by mass of water, 0.02 parts by mass of a catalyst (trade name: "TOYOCAT ET", made by TOSOH CORPORATION), 0.02 parts by mass of a silicone-based surfactant (trade name: "SH 193", made by Dow Corning Corp.) and 65 parts by mass of zirconium silicate (trade name: "SP-Z", made by HakusuiTech Co., Ltd.) were stirred and mixed to thereby obtain a dispersion liquid. Then, the prepolymer 1 and the dispersion liquid in a proportion in mass ratio of 100:102, respectively, were fully stirred and mixed in a mixing tank to thereby obtain a mixed liquid. At this time, the stirring condition was such that the number of times of shearing was 2815 and the shearing speed was 15708/sec, and air was continuously supplied to the mixing tank at a flow volume of 35 L/min. A resin plate was obtained as in Example 1, except for replacing the mixed liquid in Example 1 by the mixed liquid obtained as described above and altering the thickness of the resin plate from 1.3 mm to 2.48 mm.

Comparative Example 1

The solid MOCA was used as an active hydrogen compound, and heated and melted at 120° C., and defoamed under and mixed in a mixing tank to thereby obtain a mixed liquid. At this time, the stirring condition was such that the number of times of shearing was 1689 and the shearing speed was 9425/sec. A resin plate was obtained by casting, curing and processing the obtained mixed liquid as in Example 1.

Comparative Example 3

A generally used tin plate was used.

Figure 2:
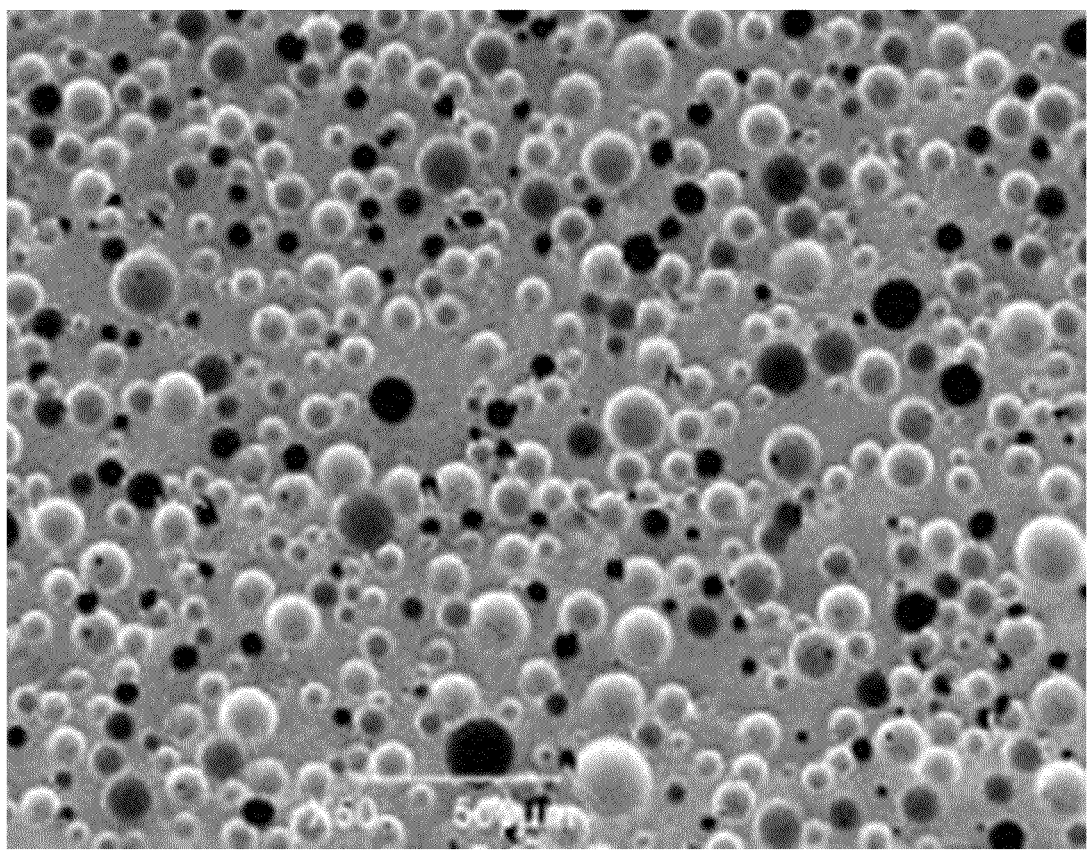
FIG. 2 is a SEM image illustrating a polished surface of a resin sheet relevant to Examples.

For the plates of Examples 1 to 3 and Comparative Examples 1 to 3, the measurements of the above various physical properties and the evaluation result of the lapping processing performance are shown in Table 1. Further, an image taken by SEM (trade name: "JSM-5500LV", made by JEOL Ltd.) of a polished surface of the resin sheet in the resin plate of Example 1 is shown in FIG. 2.

TABLE 1

|  | Example 1 | Example 2 | Example 3 | Example 4 | Example 5 | Comparative Example 1 | Comparative Example 2 | Comparative Example 3 |
|---|---|---|---|---|---|---|---|---|
| Thickness (mm) | 1.30 | 1.30 | 1.30 | 2.28 | 2.48 | 1.30 | 1.30 | 30 |
| Density (g/cm$^3$) | 0.74 | 0.92 | 0.79 | 0.92 | 0.98 | 0.51 | 1.17 | 7.30 |
| Compressibility (%) | 0.8 | 0.7 | 0.6 | 1.0 | 1.0 | 1.5 | 0.4 | — |
| Compressive Modulus (%) | 82 | 86 | 74 | 83 | 92 | 81 | 80 | — |
| Shore D Hardness (°) | 48 | 55 | 49 | 60 | 67 | 36 | 73 | — |
| Average Opening Diameter (μm) | 49.1 | 45.2 | 23.5 | 59 | 72 | 96 | — | — |
| Opening rate (%) | 34.2 | 15.2 | 18.9 | 19.4 | 26.2 | 52.1 | — | — |
| Young's Modulus (×10$^8$ N/m$^2$) | 1.26 | 2.03 | 1.49 | 4.35 | 3.65 | 0.64 | 6.65 | 414 |
| Scratch | ○ | Δ | ○ | Δ | Δ | ◎ | X | X |
| Lapping Rate (μm/hr) | 16.7 | 13.5 | 14.9 | 22.2 | 23.2 | 3.4 | 9.6 | 10.2 |
| Surface Roughness Ra (nm) | 1.83 | 1.98 | 1.17 | 1.90 | 1.83 | 1.50 | 3.80 | 4.50 | reduced pressure to thereby obtain a solid MOCA melted liquid. 50 parts by mass of a polytetramethylene ether glycol of about 2000 in number-average molecular weight, 2 parts by mass of water, 1 part by mass of a catalyst (trade name: "TOYOCAT ET", made by TOSOH CORPORATION), and 5 parts by mass of a silicone-based surfactant (trade name: "SH 193", made by Dow Corning Corp.) were stirred and mixed to thereby obtain a dispersion liquid. Then, the prepolymer 2, the solid MOCA melted liquid and the dispersion liquid in a proportion in mass ratio of 100:10:5, respectively, were fully stirred and mixed in a mixing tank to thereby obtain a mixed liquid. At this time, the stirring condition was such that the number of times of shearing was 1689 and the shearing speed was 15708/sec, and air was continuously supplied to the mixing tank at a flow volume of 80 L/min. A resin plate was obtained by casting, curing and processing the obtained mixed liquid as in Example 1.

Comparative Example 2

The solid MOCA was used as an active hydrogen compound, and heated and melted at 120° C., and defoamed under reduced pressure to thereby obtain a solid MOCA melted liquid. Then, the prepolymer 3 and the solid MOCA melted liquid in a proportion in mass ratio of 1:1 were fully stirred In Comparative Example 1 in which the Young's modulus of the resin sheet was low and the opening rate was high, although the generation of scratches was suppressed, the lapping rate was low. In Comparative Example 2 in which the Young's modulus of the resin sheet was high and no openings were observed on the polished surface, the generation of scratches was difficult to suppress and the retainability of the slurry was not good; resultantly, the lapping rate was low. Further in Comparative Example 3 using a tin plate, which came under the category of soft ones among metal plates, in the charging of the diamond abrasive grains before the lapping processing, 1 hour was taken to embed the diamond abrasive grains to nearly the same degree as in the other Examples in the plate (in the other Examples, 10 min). Further, the generation of scratches was difficult to suppress and the lapping rate was low. By contrast, in the Examples, the generation of scratches was suppressed and a high lapping rate was achieved, and the surface roughness Ra of the polished surface of the polishing workpiece could be suppressed low.

In Example 1 and Comparative Example 1, the lapping processing was carried out as in the above "lapping processing test", except for raising the lapping processing pressure from 245 g/cm$^2$ to 400 g/cm$^2$. As a result, whereas the lapping rate was 2.7 μm/10 min in Comparative Example 1, the lapping rate was 8 μm/10 min in Example 1, and was about 3 times higher than that of Comparative Example 1.

Further by using the resin sheets of Example 1, Example 4 and Example 5, the lapping processing was carried out as in the above "lapping processing test", except for replacing the polishing workpiece by the C plane of a 2-inch sapphire substrate. As a result, in Example 1, the lapping rate was 2.1 μm/hr; in Example 4, the lapping rate was 3.3 μm/hr; and in Example 5, the lapping rate was 2.6 μm/hr; it was clear that Example 5, whose Young's modulus and opening rate were both high, exhibited an especially high lapping rate to a sapphire substrate.

INDUSTRIAL APPLICABILITY

The resin plate according to the present invention is industrially applicable to lapping processing of semiconductor wafers, magnetic discs, optical glasses and the like, particularly to lapping processing of substrates composed of a silicon carbide, sapphire, silicon nitride or gallium nitride single crystal.

What is claimed is:

1. A resin lapping plate, comprising a resin sheet comprising a thermosetting polyurethane resin and having an opening rate of open pores of 10 to 50% and a Young's modulus of $7.0 \times 10^7$ to $5.0 \times 10^8$ N/m$^2$.

2. The resin lapping plate according to claim 1, wherein the resin sheet has a polished surface, and grooves are formed on the polished surface.

3. A lapping method, comprising subjecting a polishing workpiece to lapping processing by a resin lapping plate according to claim 1 in the presence of diamond abrasive grains.

4. The lapping method according to claim 3, wherein the diamond abrasive grains have an average grain diameter of 1.0 to 10 μm.

5. The lapping method according to claim 3, wherein the polishing workpiece is a substrate of silicon carbide, sapphire, silicon nitride or gallium nitride.

6. The lapping method according to claim 3, wherein the diamond abrasive grains are supplied between the resin lapping plate and the polishing workpiece, in a state of being contained in a polishing slurry.

7. A lapping method, comprising subjecting a polishing workpiece to lapping processing by a resin lapping plate according to claim 2 in the presence of diamond abrasive grains.

8. The lapping method according to claim 7, wherein the diamond abrasive grains have an average grain diameter of 1.0 to 10 μm.

9. The lapping method according to claim 4, wherein the polishing workpiece is a substrate of silicon carbide, sapphire, silicon nitride or gallium nitride.

10. The lapping method according to claim 7, wherein the polishing workpiece is a substrate of silicon carbide, sapphire, silicon nitride or gallium nitride.

11. The lapping method according to claim 8, wherein the polishing workpiece is a substrate of silicon carbide, sapphire, silicon nitride or gallium nitride.

12. The lapping method according to claim 4, wherein the diamond abrasive grains are supplied between the resin lapping plate and the polishing workpiece, in a state of being contained in a polishing slurry.

13. The lapping method according to claim 5, wherein the diamond abrasive grains are supplied between the resin lapping plate and the polishing workpiece, in a state of being contained in a polishing slurry.

14. The lapping method according to claim 7, wherein the diamond abrasive grains are supplied between the resin lapping plate and the polishing workpiece, in a state of being contained in a polishing slurry.

15. The lapping method according to claim 8, wherein the diamond abrasive grains are supplied between the resin lapping plate and the polishing workpiece, in a state of being contained in a polishing slurry.

16. The lapping method according to claim 9, wherein the diamond abrasive grains are supplied between the resin lapping plate and the polishing workpiece, in a state of being contained in a polishing slurry.

17. The lapping method according to claim 10, wherein the diamond abrasive grains are supplied between the resin lapping plate and the polishing workpiece, in a state of being contained in a polishing slurry.

18. The lapping method according to claim 11, wherein the diamond abrasive grains are supplied between the resin lapping plate and the polishing workpiece, in a state of being contained in a polishing slurry.

* * * * *